US012732154B2

(12) United States Patent
Taniguchi et al.

(10) Patent No.: US 12,732,154 B2
(45) Date of Patent: Sep. 8, 2026

(54) ACOUSTIC WAVE DEVICE

(71) Applicant: Murata Manufacturing Co., Ltd., Nagaokakyo (JP)

(72) Inventors: Yasumasa Taniguchi, Nagaokakyo (JP); Hideki Iwamoto, Nagaokakyo (JP); Hiromu Okunaga, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 150 days.

(21) Appl. No.: 18/423,452

(22) Filed: Jan. 26, 2024

(65) Prior Publication Data

US 2024/0162878 A1 May 16, 2024

Related U.S. Application Data

(63) Continuation of application No. PCT/JP2022/035935, filed on Sep. 27, 2022.

(30) Foreign Application Priority Data

Sep. 29, 2021 (JP) ................................ 2021-159455

(51) Int. Cl.
*H03H 9/02* (2006.01)

(52) U.S. Cl.
CPC .... *H03H 9/02125* (2013.01); *H03H 9/02039* (2013.01); *H03H 9/02228* (2013.01); *H03H 9/02992* (2013.01)

(58) Field of Classification Search
CPC ........ H03H 9/175; H03H 9/173; H03H 9/568; H03H 9/132; H03H 9/02228
See application file for complete search history.

(56) References Cited

U.S. PATENT DOCUMENTS

| | | | | |
|---|---|---|---|---|
| 9,093,979 | B2 * | 7/2015 | Wang | H10N 30/40 |
| 10,979,019 | B2 * | 4/2021 | Giner De Haro | H03H 9/145 |
| 2016/0118956 | A1 | 4/2016 | Kihara et al. | |

(Continued)

FOREIGN PATENT DOCUMENTS

| | | | |
|---|---|---|---|
| CN | 112054781 A * | 12/2020 | H03H 9/19 |
| JP | 2005217818 A | 8/2005 | |

(Continued)

OTHER PUBLICATIONS

International Search Report in PCT/JP2022/035935, mailed Dec. 20, 2022, 3 pages.

(Continued)

*Primary Examiner* — Quan Tra
(74) *Attorney, Agent, or Firm* — Keating & Bennett, LLP

(57) ABSTRACT

In an acoustic wave device, a first IDT electrode is provided on a first main surface of a piezoelectric film, and a second IDT electrode is provided on a second main surface of the piezoelectric film. A crystal c-axis of the piezoelectric film is tilted with respect to a direction normal to the first and second main surfaces. A direction of an electric field generated between a busbar of a comb-shaped electrode and end portions of electrode fingers facing the busbar in the first IDT electrode and a direction of an electric field generated between a busbar and end portions of electrode fingers facing the busbar in the second IDT electrode are opposite directions.

18 Claims, 10 Drawing Sheets

(56) References Cited

U.S. PATENT DOCUMENTS

| | | | | |
|---|---|---|---|---|
| 2016/0352304 | A1 | 12/2016 | Kadota et al. | |
| 2018/0019728 | A1* | 1/2018 | Kaajakari | H10N 30/853 |
| 2018/0287047 | A1* | 10/2018 | Rinaldi | H10N 30/40 |
| 2020/0295730 | A1* | 9/2020 | Nagatomo | H03H 9/14541 |

FOREIGN PATENT DOCUMENTS

| | | | |
|---|---|---|---|
| WO | 2015002047 | A1 | 1/2015 |
| WO | 2015137054 | A1 | 9/2015 |

OTHER PUBLICATIONS

Written Opinion in PCT/JP2022/035935, mailed Dec. 20, 2022, 4 pages.

* cited by examiner

FIG. 14

ACOUSTIC WAVE DEVICE

CROSS REFERENCE TO RELATED APPLICATIONS

This application claims the benefit of priority to Japanese Patent Application No. 2021-159455 filed on Sep. 29, 2021 and is a Continuation Application of PCT Application No. PCT/JP2022/035935 filed on Sep. 27, 2022. The entire contents of each application are hereby incorporated herein by reference.

BACKGROUND OF THE INVENTION

1. Field of the Invention

The present invention relates to an acoustic wave device in which an IDT electrode is provided on both surfaces of a piezoelectric film.

2. Description of the Related Art

Hitherto, an acoustic wave device is known in which an IDT electrode is provided on each of opposing first and second main surfaces of a piezoelectric film. In WO2015/137054A1, for example, a first IDT electrode is formed on a first main surface of a piezoelectric substrate made of $LiNbO_3$, while a second IDT electrode is formed on a second main surface of the piezoelectric substrate. With the application of an opposite-phase AC voltage to the first and second IDT electrodes, a Lamb wave mainly formed of an SH-wave high-order mode is excited.

SUMMARY OF THE INVENTION

In an acoustic wave device, such as that disclosed in WO2015/137054A1, if the crystal axis of a piezoelectric film is tilted with respect to a direction normal to the first and second main surfaces of the piezoelectric film, a high-order nonlinear distortion, such as a second-order nonlinear distortion, may be increased.

Example embodiments of the present invention provide acoustic wave devices that each can reduce a high-order nonlinear distortion.

An acoustic wave device according to an example embodiment of the present invention includes a piezoelectric film and first and second IDT electrodes. The piezoelectric film includes first and second main surfaces facing each other. The first IDT electrode is provided on the first main surface of the piezoelectric film. The second IDT electrode is provided on the second main surface of the piezoelectric film. A crystal c-axis of the piezoelectric film is tilted with respect to a direction normal to the first and second main surfaces of the piezoelectric film. The first IDT electrode and the second IDT electrode at least partially face each other with the piezoelectric film interposed therebetween. Each of the first and second IDT electrodes includes two comb-shaped electrodes interdigitated with each other. Each of the comb-shaped electrodes includes plural electrode fingers and a busbar to which the plural electrode fingers are connected. A direction of an electric field generated between the busbar and end portions of the electrode fingers facing the busbar in the first IDT electrode and a direction of an electric field generated between the busbar and end portions of the electrode fingers facing the busbar in the second IDT electrode are opposite directions.

According to example embodiments of the present invention, it is possible to provide acoustic wave devices that each can reduce a high-order nonlinear distortion.

The above and other elements, features, steps, characteristics and advantages of the present invention will become more apparent from the following detailed description of the example embodiments with reference to the attached drawings.

BRIEF DESCRIPTION OF THE DRAWINGS

FIG. 14 is an elevational cross-sectional view of an acoustic wave device according to a fifth example embodiment of the present invention.

DETAILED DESCRIPTION OF THE EXAMPLE EMBODIMENTS

The present invention will be explained below with reference to the drawings through illustration of specific example embodiments.

The individual example embodiments disclosed in the specification are only examples. The configurations described in different example embodiments may partially be replaced by or combined with each other.

Figure 1:
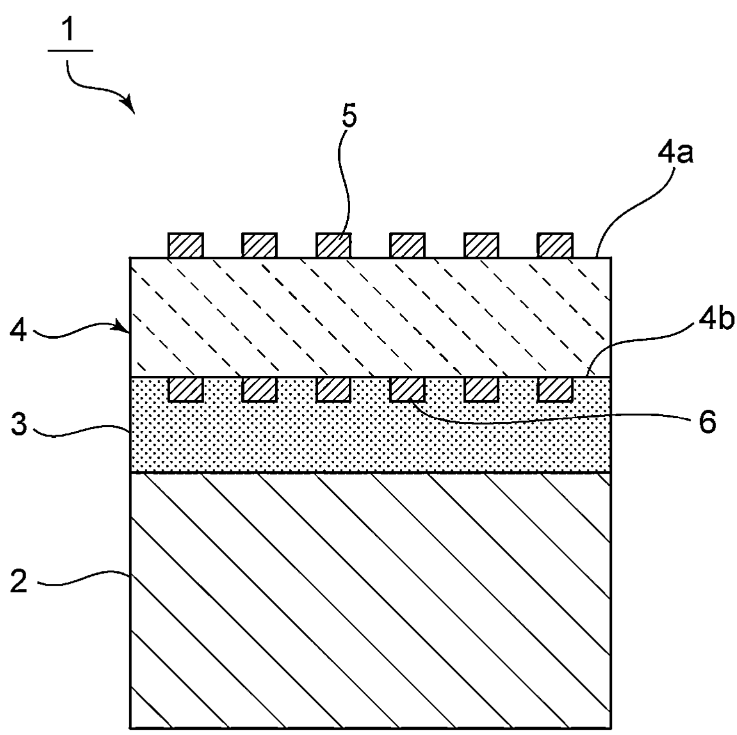
FIG. 1 is an elevational cross-sectional view of an acoustic wave device according to a first example embodiment of the present invention.
Figure 2:
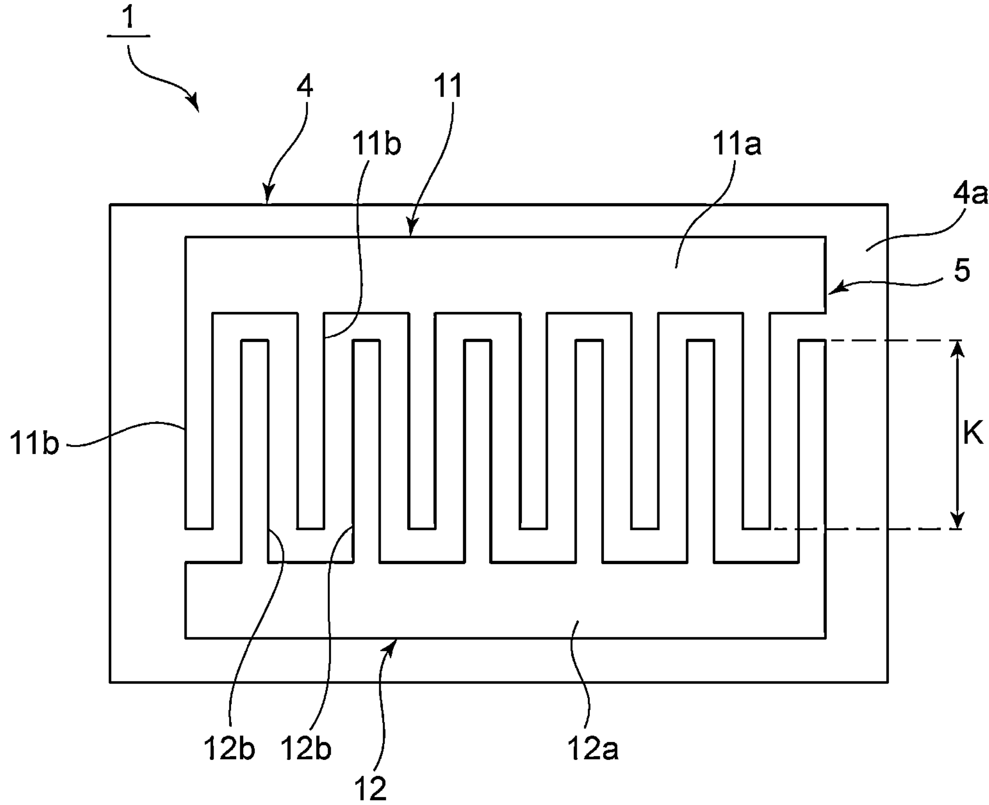
FIG. 2 is a plan view of the acoustic wave device according to the first example embodiment of the present invention.

FIG. 1 is an elevational cross-sectional view of an acoustic wave device according to a first example embodiment of the present invention. FIG. 2 is a plan view of the acoustic wave device according to the first example embodiment of the present invention.

An acoustic wave device 1 includes a support substrate 2. The support substrate 2 is made of Si. Nonetheless, the support substrate 2 may be formed of another suitable insulator or semiconductor.

A silicon oxide film 3, which serves as an intermediate layer, is stacked on the support substrate 2. A piezoelectric film 4 is stacked on the silicon oxide film 3. That is, the piezoelectric film 4 is indirectly stacked on the support substrate 2 with the silicon oxide film 3 interposed therebetween.

In the first example embodiment, the piezoelectric film 4 is made of $LiTaO_3$. The piezoelectric film 4 includes first and second main surfaces 4*a* and 4*b* facing each other. The piezoelectric film 4 is stacked on the silicon oxide film 3 such that the second main surface 4*b* faces the silicon oxide film 3. The crystal c-axis of the piezoelectric film 4 is tilted with respect to a direction normal to the main surfaces of the piezoelectric film 4, that is, the thickness direction of the piezoelectric film 4.

The material for the piezoelectric film 4 is not limited to $LiTaO_3$, which is used in the first example embodiment, and may be formed of another piezoelectric single crystal, such as $LiNbO_3$.

A first IDT electrode 5 is provided on the first main surface 4*a* of the piezoelectric film 4. A second IDT electrode 6 is provided on the second main surface 4*b* of the piezoelectric film 4. As illustrated in FIG. 2, the first IDT electrode 5 includes first and second comb-shaped electrodes 11 and 12.

The first comb-shaped electrode 11 includes a first busbar 11*a* and multiple first electrode fingers 11*b*. One end portion of each of the first electrode fingers 11*b* is connected to the first busbar 11*a*. The second comb-shaped electrode 12 includes a second busbar 12*a* and multiple second electrode fingers 12*b*. The first busbar 11*a* and the second busbar 12*a* face each other with a certain distance therebetween. One end portion of each of the second electrode fingers 12*b* is connected to the second busbar 12*a*. The multiple first electrode fingers 11*b* and the multiple second electrode fingers 12*b* interdigitate each other.

The center-to-center distance between adjacent electrode fingers connected to different potentials (between a first electrode finger 11*b* and a second electrode finger 12*b*, for example) is the electrode finger pitch. The wavelength $\lambda$ is expressed by $\lambda=2p$, where p is the electrode finger pitch.

The direction perpendicular to the extending direction of the first and second electrode fingers 11*b* and 12*b* is the acoustic wave propagating direction. As seen from this acoustic wave propagating direction, a region where the first and second electrode fingers 11*b* and 12*b* face each other is an interdigital region K.

Figure 3:
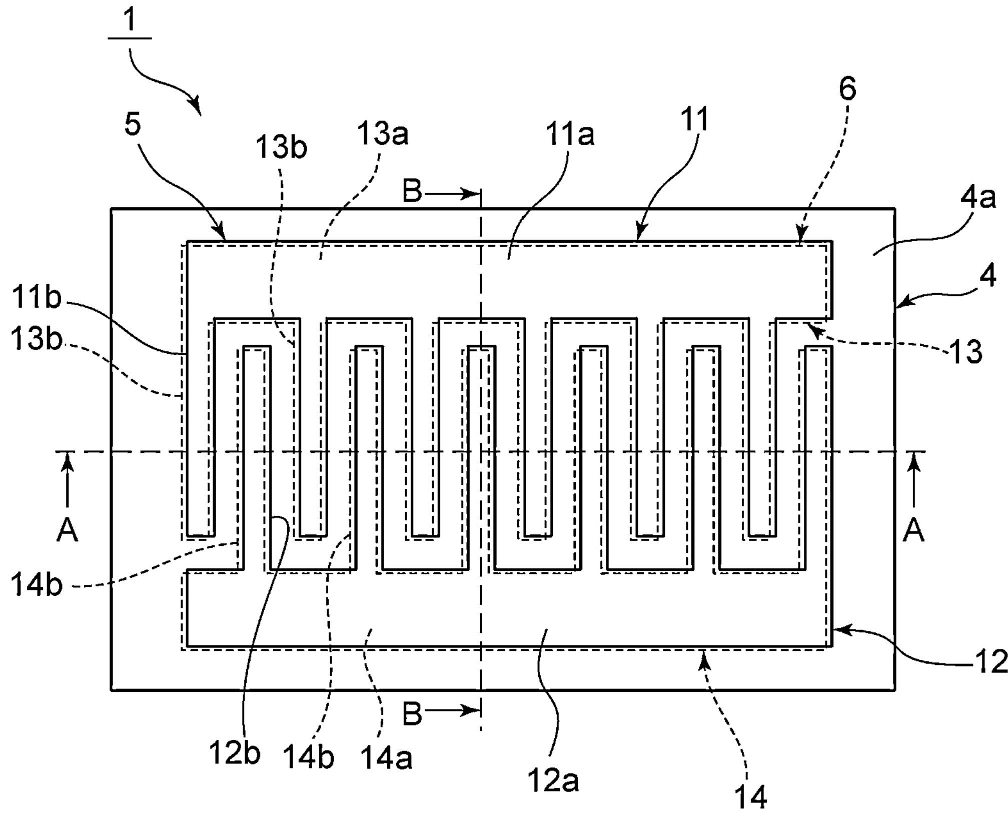
FIG. 3 is a plan view for explaining the positional relationship between a first IDT electrode provided on a first main surface and a second IDT electrode provided on a second main surface in the acoustic wave device of the first example embodiment of the present invention.

FIG. 3 is a plan view for explaining the positional relationship between the first IDT electrode 5 and the second IDT electrode 6. In FIG. 3, the positions of third and fourth comb-shaped electrodes 13 and 14 located under the first and second comb-shaped electrodes 11 and 12 are slightly displaced from the first and second comb-shaped electrodes 11 and 12. In actuality, however, the first and second comb-shaped electrodes 11 and 12 and the third and fourth comb-shaped electrodes 13 and 14 match each other in a plan view.

The third comb-shaped electrode 13 includes a third busbar 13*a* and multiple third electrode fingers 13*b*. Likewise, the fourth comb-shaped electrode 14 includes a fourth busbar 14*a* and multiple fourth electrode fingers 14*b*. The multiple third electrode fingers 13*b* and the multiple fourth electrode fingers 14*b* interdigitate each other.

In the acoustic wave device 1, the direction of an electric field generated between the busbar and the end portions of the electrode fingers facing the busbar in the first IDT electrode and the direction of an electric field generated between the busbar and the end portions of the electrode fingers facing the busbar in the second IDT electrode are opposite directions. This can reduce a second-order nonlinear distortion. This will be discussed below in detail with reference to FIGS. 4 through 8.

Figure 4:
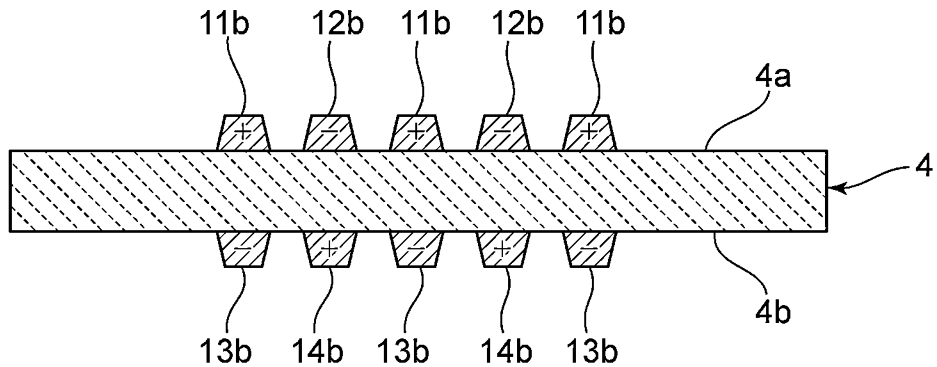
FIG. 4 is a partial sectional view taken along line A-A in FIG. 3.
Figure 5:
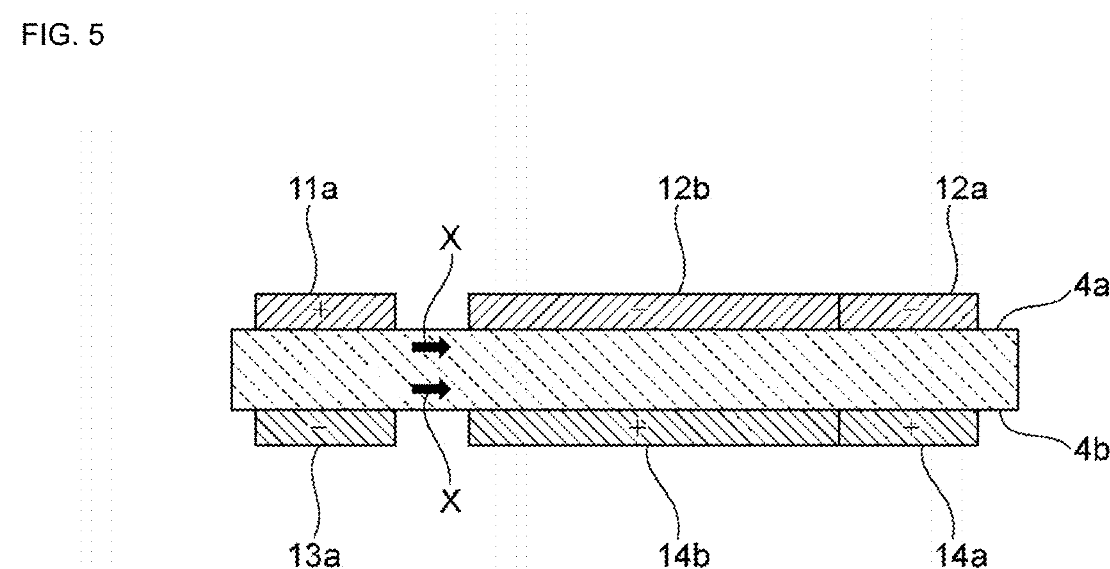
FIG. 5 is a partial sectional view taken along line B-B in FIG. 3.

FIG. 4 is a partial sectional view taken along line A-A in FIG. 3. FIG. 5 is a partial sectional view taken along line B-B in FIG. 3.

As shown in FIG. 4, the first electrode fingers 11*b* and the third electrode fingers 13*b* face each other with the piezoelectric film 4 interposed therebetween. Likewise, the second electrode fingers 12*b* and the fourth electrode fingers 14*b* face each other with the piezoelectric film 4 interposed therebetween. The first and second IDT electrodes 5 and 6 are driven so that the polarity of a potential of the multiple first electrode fingers 11*b* and that of the multiple third electrode fingers 13*b* become opposite polarities. The first and second IDT electrodes 5 and 6 are driven so that the polarity of a potential of the multiple second electrode fingers 12*b* and that of the multiple fourth electrode fingers 14*b* become opposite polarities.

As illustrated in FIG. 5, regarding the second electrode finger 12*b* and the fourth electrode finger 14*b* matching each other, the potential of the second electrode finger 12*b* and that of the fourth electrode finger 14*b* are those of opposite polarities when the first and second IDT electrodes 5 and 6 are in the driving state. In this case, on the first main surface 4*a* of the piezoelectric film 4, the first busbar 11*a* of the first comb-shaped electrode 11 and the second electrode finger 12*b* face each other in opposite polarities. Likewise, on the second main surface 4*b* of the piezoelectric film 4, the third busbar 13*a* and the fourth electrode fingers 14*b* face each other in opposite polarities.

The first busbar 11*a* and the third busbar 13*a* face each other in opposite polarities with the piezoelectric film 4 interposed therebetween. Likewise, the second busbar 12*a* and the fourth busbar 14*a* face each other in opposite polarities with the piezoelectric film 4 interposed therebetween. That is, regarding busbars facing each other with the piezoelectric film interposed therebetween, their potentials are different from each other. Accordingly, the direction of an electric field generated between the first busbar 11*a* and the end portions of the second electrode fingers 12*b* and the direction of an electric field generated between the third busbar 13*a* and the end portions of the fourth electrode fingers 14*b* are opposite directions. In this case, the direction of an electric field between the first and second comb-shaped electrodes 11 and 12 and the direction of an electric field between the third and fourth comb-shaped electrodes 13 and 14 are opposite directions.

The crystal c-axis of the piezoelectric film 4 is tilted with respect to the thickness direction of the piezoelectric film 4. Hence, the direction of a second-order nonlinear signal that causes a second-order nonlinear distortion at the time of the excitation of the acoustic wave device 1 is the direction indicated by the arrows X in FIG. 5 if the piezoelectric film 4 is a rotation-Y-cut X-propagation film. Although the direction of the nonlinear signal on the first main surface 4*a* of the piezoelectric film 4 and that on the second main surface 4*b* thereof are the same, the direction of a potential difference on the first main surface 4*a* and that on the second main surface 4*b* are opposite directions. A current of the nonlinear signal on the first main surface 4*a* and that on the second main surface 4*b* thus cancel each other out. As a result, the second-order nonlinear signal can be decreased in the acoustic wave device 1.

As an example structure of the first example embodiment, an example of an acoustic wave device was formed with the following specific design conditions.

The wavelength λ determined by the electrode finger pitch of the first and second IDT electrodes 5 and 6 was set to 1 μm.

As the piezoelectric film 4, 30°-Y-cut $LiTaO_3$ was used. The film thickness of the piezoelectric film 4 made of $LiTaO_3$ was 0.2λ.

As the support substrate 2, a support substrate having a silicon (100) plane was used.

The X axis of $LiTaO_3$ and the direction of the Si(110) plane were in parallel with each other.

As the first and second IDT electrodes 5 and 6, Al was used and the film thickness was 0.07λ. The duty ratio of the first and second IDT electrodes 5 and 6 was 0.5.

The film thickness of the silicon oxide film 3 was 0.185λ.

Figure 6A:
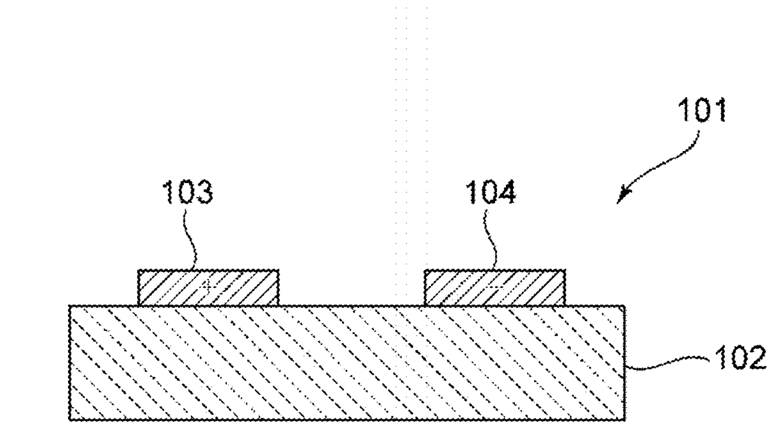
FIG. 6A is a schematic elevational cross-sectional view of a known acoustic wave device in which an IDT electrode is provided on one surface of a piezoelectric film.
Figure 6B:
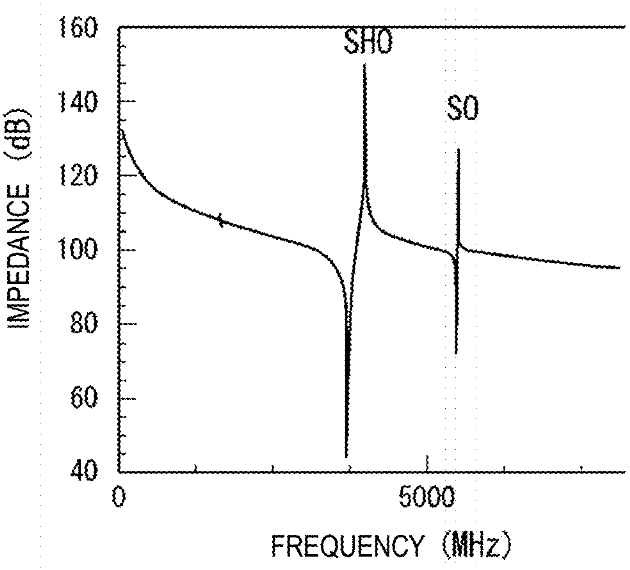
FIG. 6B is a graph illustrating the resonance characteristics of the known acoustic wave device.
Figure 7A:
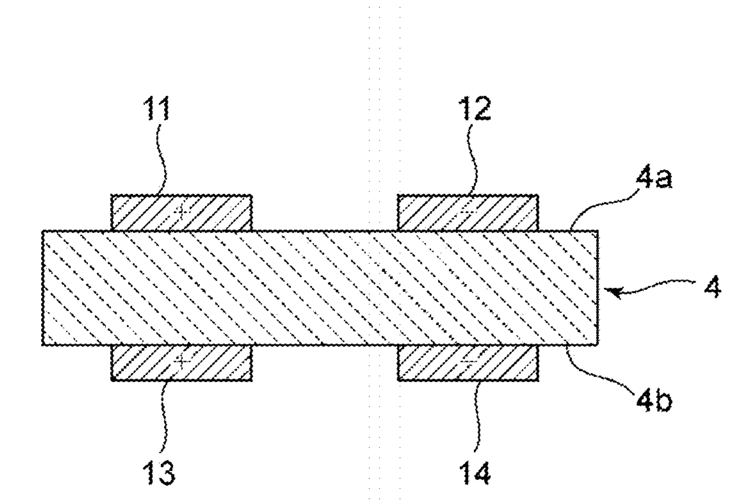
FIG. 7A is a schematic elevational cross-sectional view of an acoustic wave device in which the polarity of an IDT electrode provided on one surface of a piezoelectric film and that of an IDT electrode provided on the other surface of the piezoelectric film are the same.
Figure 8A:
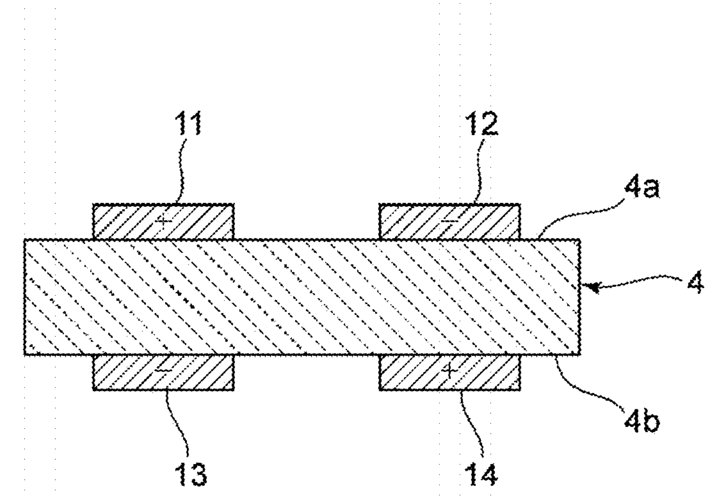
FIG. 8A is a schematic elevational cross-sectional view of an acoustic wave device in which the polarity of an IDT electrode provided on one surface of a piezoelectric film and that of an IDT electrode provided on the other surface of the piezoelectric film are opposite polarities.

FIG. 7A illustrates the above-described structure of the first example embodiment in which the first comb-shaped electrode 11 and the third comb-shaped electrode 13 have the same potential, while the second comb-shaped electrode 12 and the fourth comb-shaped electrode 14 have the same potential. FIG. 8A illustrates the above-described structure of the first example embodiment in which, when the first and second IDT electrodes 5 and 6 are in the driving state, the first comb-shaped electrode 11 and the third comb-shaped electrode 13 have opposite potentials, while the second comb-shaped electrode 12 and the fourth comb-shaped electrode 14 have opposite potentials. FIG. 6A illustrates the relationship between comb-shaped electrodes 103 and 104 provided on a piezoelectric film 102 of a known acoustic wave device 101. In the known acoustic wave device 101, as illustrated in FIG. 6B, the resonance characteristics in the SH0 mode and the S0 mode are observed. If the SH0 mode is used for a filter, for example, an unwanted spurious response appears in the S0 mode outside the pass band, thus degrading the attenuation characteristics outside the pass band.

Figure 8B:
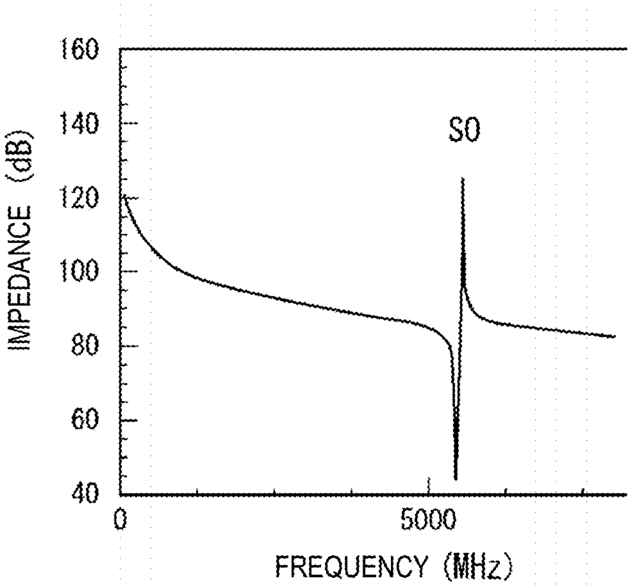
FIG. 8B is a graph illustrating the resonance characteristics of this acoustic wave device.

As shown in FIG. 8A, in the structure in which the first and second comb-shaped electrodes 11 and 12 are disposed on the first main surface 4*a* of the piezoelectric film 4 and the third and fourth comb-shaped electrodes 13 and 14 are disposed on the second main surface 4*b*, the potential of the first comb-shaped electrode 11 and that of the third comb-shaped electrode 13 are those of opposite polarities, while the potential of the second comb-shaped electrode 12 and that of the fourth comb-shaped electrode 14 are those of opposite polarities. In this case, the resonance characteristics of the S0 mode are obtained and no resonance response in the SH0 mode is observed, as shown in FIG. 8B.

Figure 7B:
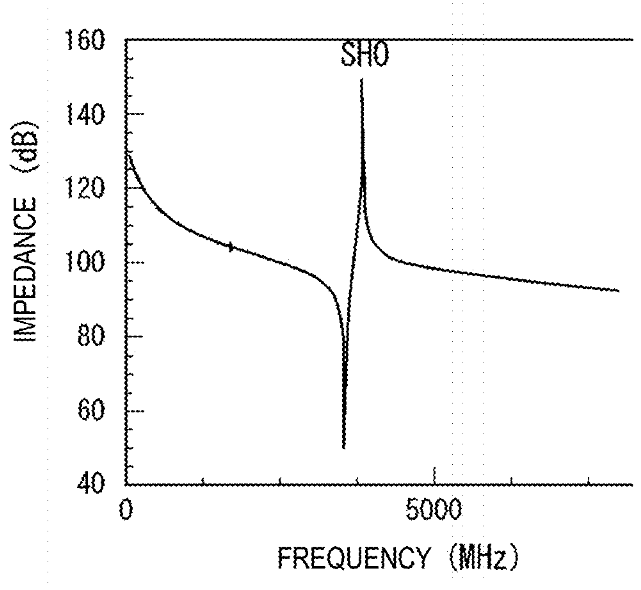
FIG. 7B is a graph illustrating the resonance characteristics of this acoustic wave device.

FIG. 7A is a schematic elevational cross-sectional view of a structure in which the first and second comb-shaped electrodes 11 and 12 are disposed on the first main surface 4*a* of the piezoelectric film 4 and the third and fourth comb-shaped electrodes 13 and 14 are disposed on the second main surface 4*b*. In this structure, the first comb-shaped electrode 11 and the third comb-shaped electrode 13 have the same potential, while the second comb-shaped electrode 12 and the fourth comb-shaped electrode 14 have the same potential. In this case, the resonance characteristics of the SH0 mode are obtained and almost no resonance response in the S0 mode is observed, as shown in FIG. 7B. This can reduce the size of the acoustic wave device, compared with when the S0 mode is used. When the SH0 mode is used as described above, it is preferable that the film thickness of the piezoelectric film 4 be about 1λ or smaller, the cut-angles of $LiTaO_3$ be about −10° to about −70°, that is, (about −10° to about −70)°-Y-cut X-propagation $LiTaO_3$ be used, the film thickness of the first and second IDT electrodes 5 and 6 made of Al be about 0.15λ or smaller, and the duty ratio of the first and second IDT electrodes 5 and 6 be about 0.2 to about 0.8, for example. With these ranges, high-order modes outside the pass band can be reduced more effectively while the SH0 mode is being used.

In the case of the first example embodiment, with the above-described configuration, the resonance characteristics of the S0 mode can be obtained effectively and the second-order nonlinear distortion can be eliminated.

Figure 9:
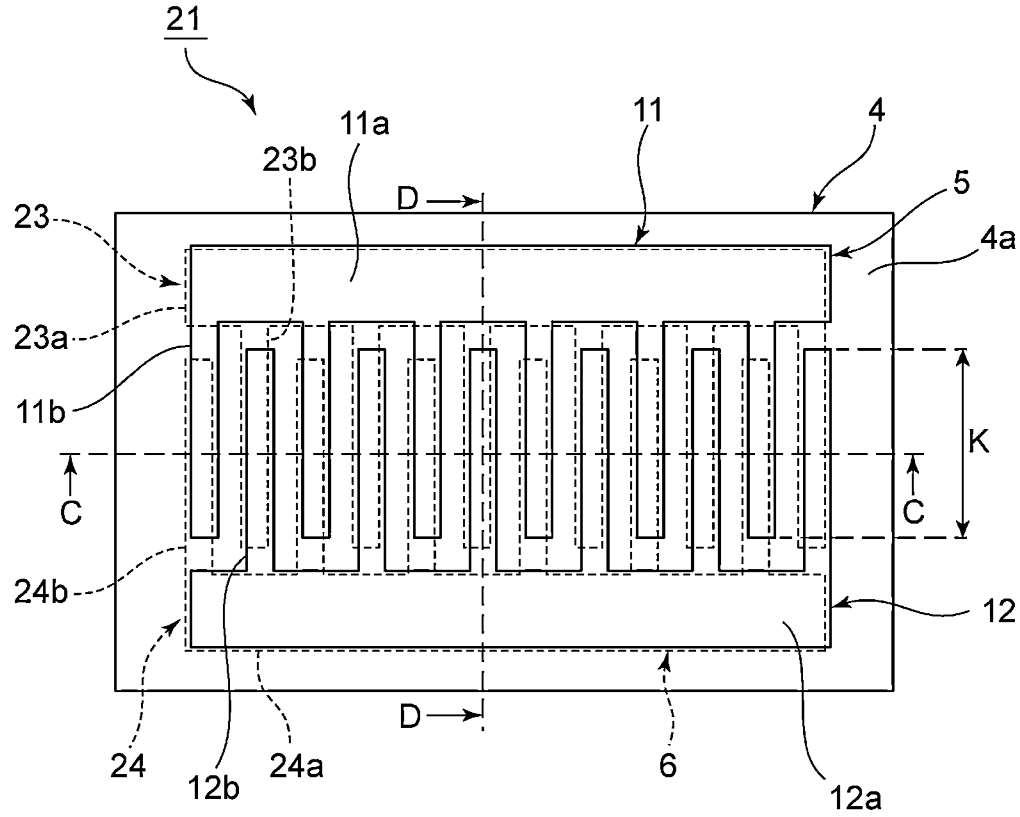
FIG. 9 is a plan view of an acoustic wave device according to a second example embodiment of the present invention.

FIG. 9 is a plan view of an acoustic wave device according to a second example embodiment of the present invention. In an acoustic wave device 21, a first IDT electrode 5 is disposed on the first main surface 4*a* of the piezoelectric film 4. The first IDT electrode 5 includes first and second comb-shaped electrodes 11 and 12. The first comb-shaped electrode 11 includes a first busbar 11*a* and multiple first electrode fingers 11*b*. The second comb-shaped electrode 12 includes a second busbar 12*a* and multiple second electrode fingers 12*b*. This structure is similar to that of the first example embodiment.

As indicated by the broken lines, on the second main surface 4*b* of the piezoelectric film 4, a second IDT electrode 6 is disposed. The second IDT electrode 6 includes third and fourth comb-shaped electrodes 23 and 24. The third comb-shaped electrode 23 includes a third busbar 23*a* and multiple third electrode fingers 23*b*. One end portion of each of the third electrode fingers 23*b* is connected to the third busbar 23*a*. The fourth comb-shaped electrode 24 includes a fourth busbar 24*a* and multiple fourth electrode fingers 24*b*. One end portion of each of the fourth electrode fingers 24*b* is connected to the fourth busbar 24*a*. The third electrode fingers 23*b* and the fourth electrode fingers 24*b* interdigitate each other.

The first busbar 11*a* and the third busbar 23*a* match each other via the piezoelectric film 4 interposed therebetween. Likewise, the second busbar 12*a* and the fourth busbar 24*a* match each other via the piezoelectric film 4 interposed therebetween. The polarity of the first busbar 11*a* and that of the third busbar 23*a* are opposite polarities, while the polarity of the second busbar 12*a* and that of the fourth busbar 24*a* are opposite polarities. That is, regarding busbars facing each other with the piezoelectric film interposed therebetween, their potentials are different from each other.

The first electrode fingers 11*b* and the fourth electrode fingers 24*b* overlap each other with the piezoelectric film 4 interposed therebetween. The third electrode fingers 23*b* and the second electrode fingers 12*b* overlap each other with the piezoelectric film 4 interposed therebetween. That is, a region where the first through fourth electrode fingers 11*b*, 12*b*, 23*b*, and 24*b* overlap each other as seen from the acoustic wave propagating direction is an interdigital region K. In the interdigital region K, the first electrode fingers 11*b* and the fourth electrode fingers 24*b* face each other with the piezoelectric film 4 interposed therebetween, while the second electrode fingers 12*b* and the third electrode fingers 23*b* face each other with the piezoelectric film 4 interposed therebetween, as stated above. That is, the fourth electrode fingers 24*b* are each located under a gap between the end portion of the corresponding first electrode finger 11*b* and the second busbar 12*a*, while the third electrode fingers 23*b* are each located under a gap between the end portion of the corresponding second electrode finger 12*b* and the first busbar 11*a*. The first comb-shaped electrode 11 and the fourth comb-shaped electrode 24 have the same potential, while the second comb-shaped electrode 12 and the third comb-shaped electrode 23 have the same potential.

In the second example embodiment, too, the direction of an electric field generated between the busbar and the end portions of the electrode fingers facing the busbar in the first IDT electrode 5 and the direction of an electric field generated between the busbar and the end portions of the electrode fingers facing the busbar in the second IDT electrode 6 are opposite directions. It is thus possible to reduce the second-order nonlinear distortion.

Figure 10:
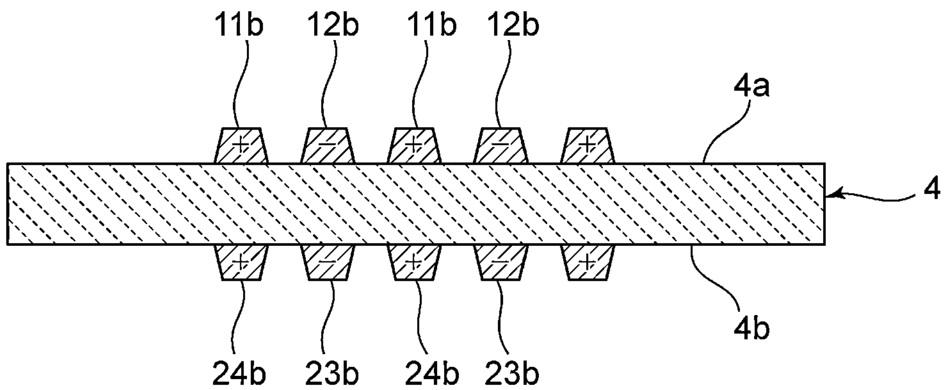
FIG. 10 is a schematic partial sectional view taken along line C-C in FIG. 9.
Figure 11:
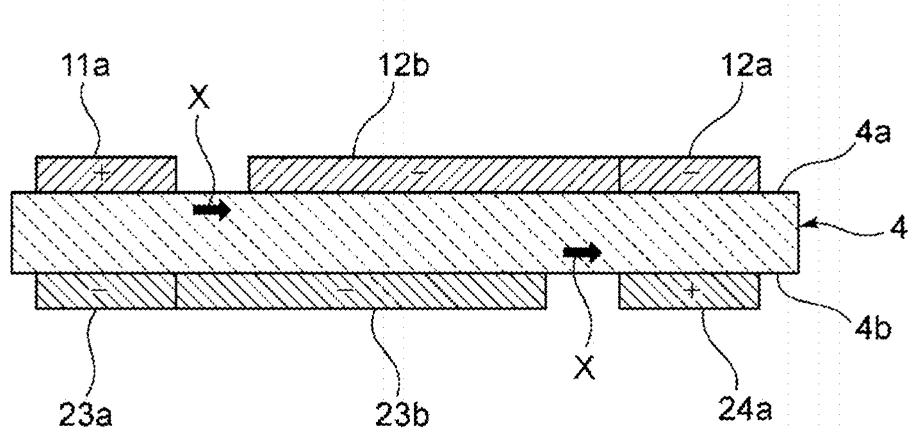
FIG. 11 is a partial sectional view taken along line D-D in FIG. 9.

FIG. 10 is a partial sectional view taken along line C-C in FIG. 9. FIG. 11 is a partial sectional view taken along line D-D in FIG. 9.

The polarity of the potential of the first electrode fingers 11*b* and that of the fourth electrode fingers 24*b* are the same when the first and second IDT electrodes 5 and 6 are in the driving state. Likewise, the polarity of the potential of the second electrode fingers 12*b* and that of the third electrode fingers 23*b* are the same when the first and second IDT electrodes 5 and 6 are in the driving state. That is, the polarity of the first electrode fingers 11*b* and that of the fourth electrode fingers 24*b* overlapping each other with the piezoelectric film 4 interposed therebetween are the same, while the polarity of the second electrode fingers 12*b* and that of the third electrode fingers 23*b* overlapping each other with the piezoelectric film 4 interposed therebetween are the same. The polarity of the first electrode finger 11*b* and that of the second electrode finger 12*b* adjacent to each other are opposite polarities, while the polarity of the third electrode finger 23*b* and that of the fourth electrode finger 24*b* adjacent to each other are opposite polarities.

Hence, as illustrated in FIG. 11, the direction of an electric field generated in a portion where the first busbar 11*a* and the second electrode finger 12*b* face each other and the direction of an electric field generated in a portion where the third electrode finger 23*b* and the fourth busbar 24*a* face each other are opposite directions.

The direction of a second-order nonlinear signal is indicated by the arrows X in FIG. 11. In the second example embodiment, too, regarding the direction of a potential difference of the second-order nonlinear distortion, the direction of the electric field between the busbar and the end portions of the electrode fingers facing the busbar in the first IDT electrode 5 on the first main surface 4*a* and the direction of the electric field between the busbar and the end portions of the electrode fingers facing the busbar in the second IDT electrode 6 on the second main surface 4*b* become opposite directions, thus making it possible to reduce a nonlinear distortion. Additionally, as shown in FIG. 7B, the resonance characteristics in the SH0 mode can be obtained. The size of the acoustic wave device can thus be reduced, compared with when the S0 mode is used, as stated above.

Figure 12:
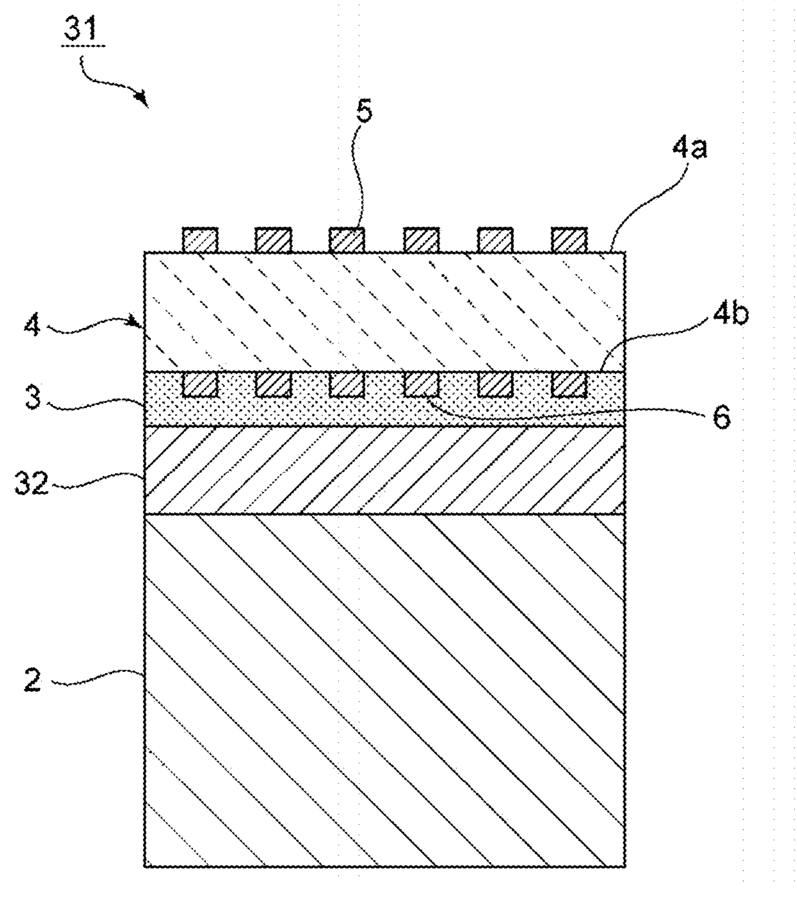
FIG. 12 is an elevational cross-sectional view of an acoustic wave device according to a third example embodiment of the present invention.

FIG. 12 is an elevational cross-sectional view of an acoustic wave device according to a third example embodiment of the present invention. In an acoustic wave device 31, a high acoustic velocity film 32 is stacked between the support substrate 2 and the silicon oxide film 3. The high acoustic velocity film 32 is a film made of a high acoustic velocity material. The high acoustic velocity material can be defined as follows. The acoustic velocity of a bulk wave propagating through the high acoustic velocity material is higher than that of an acoustic wave propagating through the piezoelectric film 4. In the third example embodiment, the high acoustic velocity film 32 is made of SiN. However, the high acoustic velocity material for the high acoustic velocity film 32 is not limited to SiN. Other examples of the high acoustic velocity material are silicon, aluminum oxide, silicon carbide, sapphire, lithium tantalate, lithium niobate, quartz, alumina, zirconia, cordierite, mullite, steatite, forsterite, magnesia, a DLC (diamond-like carbon) film or diamond, and a material having any of the above-described materials as a principal component.

The silicon oxide film 3 is a low acoustic velocity film made of a low acoustic velocity material. The low acoustic velocity material can be defined as follows. The acoustic velocity of a bulk wave propagating through the low acoustic velocity material is lower than that of a bulk wave propagating through the piezoelectric film 4. Apart from silicon oxide, examples of the low acoustic velocity material are glass, silicon oxynitride, tantalum oxide, a compound obtained by adding fluorine, carbon, or boron to silicon oxide, and a material having any of the above-described materials as a principal component.

The acoustic wave device 31 is similar to the acoustic wave device 1 other than that the above-described high acoustic velocity film 32 is used as a portion of the intermediate layer. Hence, the acoustic wave device 31 can also reduce the second-order nonlinear distortion. In the third example embodiment, the support substrate 2 is made of silicon. However, the support substrate 2 may be made of, for example, a high acoustic velocity material other than silicon.

Figure 13:
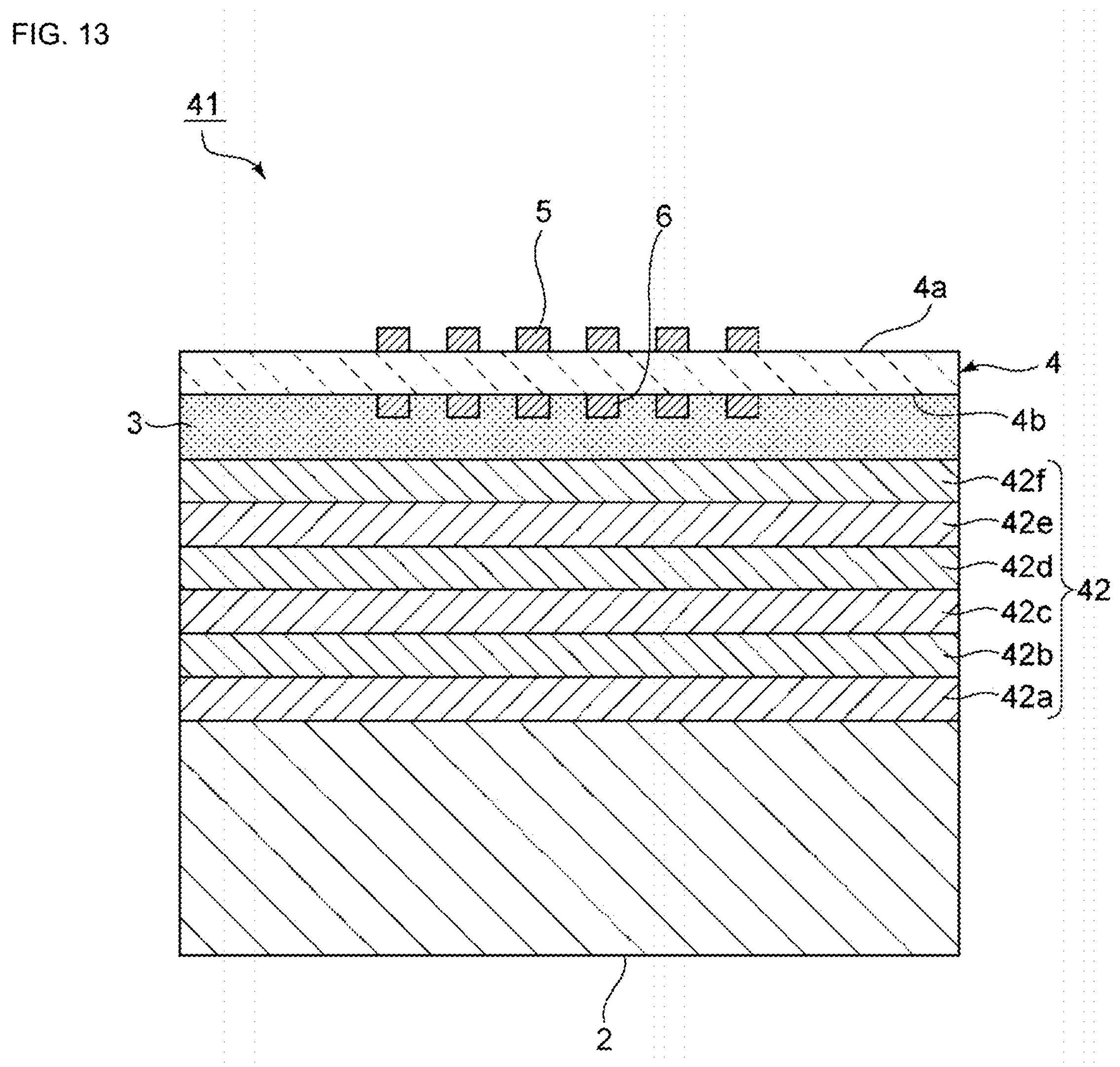
FIG. 13 is an elevational cross-sectional view of an acoustic wave device according to a fourth example embodiment of the present invention.

FIG. 13 is an elevational cross-sectional view of an acoustic wave device according to a fourth example embodiment of the present invention. In an acoustic wave device 41, an acoustic reflective layer 42 and a silicon oxide film 3 are stacked between the support substrate 2 and the piezoelectric film 4. The silicon oxide film 3 may be omitted.

The acoustic reflective layer 42 is a multilayer body including high acoustic impedance layers 42*a*, 42*c*, and 42*e* and low acoustic impedance layers 42*b*, 42*d*, and 42*f*. The high acoustic impedance layers 42*a*, 42*c*, and 42*e* are made of a high acoustic impedance material of a relatively high acoustic impedance. The low acoustic impedance layers 42*b*, 42*d*, and 42*f* are made of a low acoustic impedance material of a relatively low acoustic impedance. A suitable dielectric body or insulator that satisfies the above-described relationship in the acoustic impedance level may be used as the low acoustic impedance material and the high acoustic impedance material.

In an example embodiment of the present invention, the above-described acoustic reflective layer 42 may be included as the intermediate layer. In the acoustic wave device 41, the piezoelectric film 4 and the first and second IDT electrodes 5 and 6 are configured similarly to those in the first example embodiment. It is thus possible to reduce the second-order nonlinear distortion.

Figure 14:
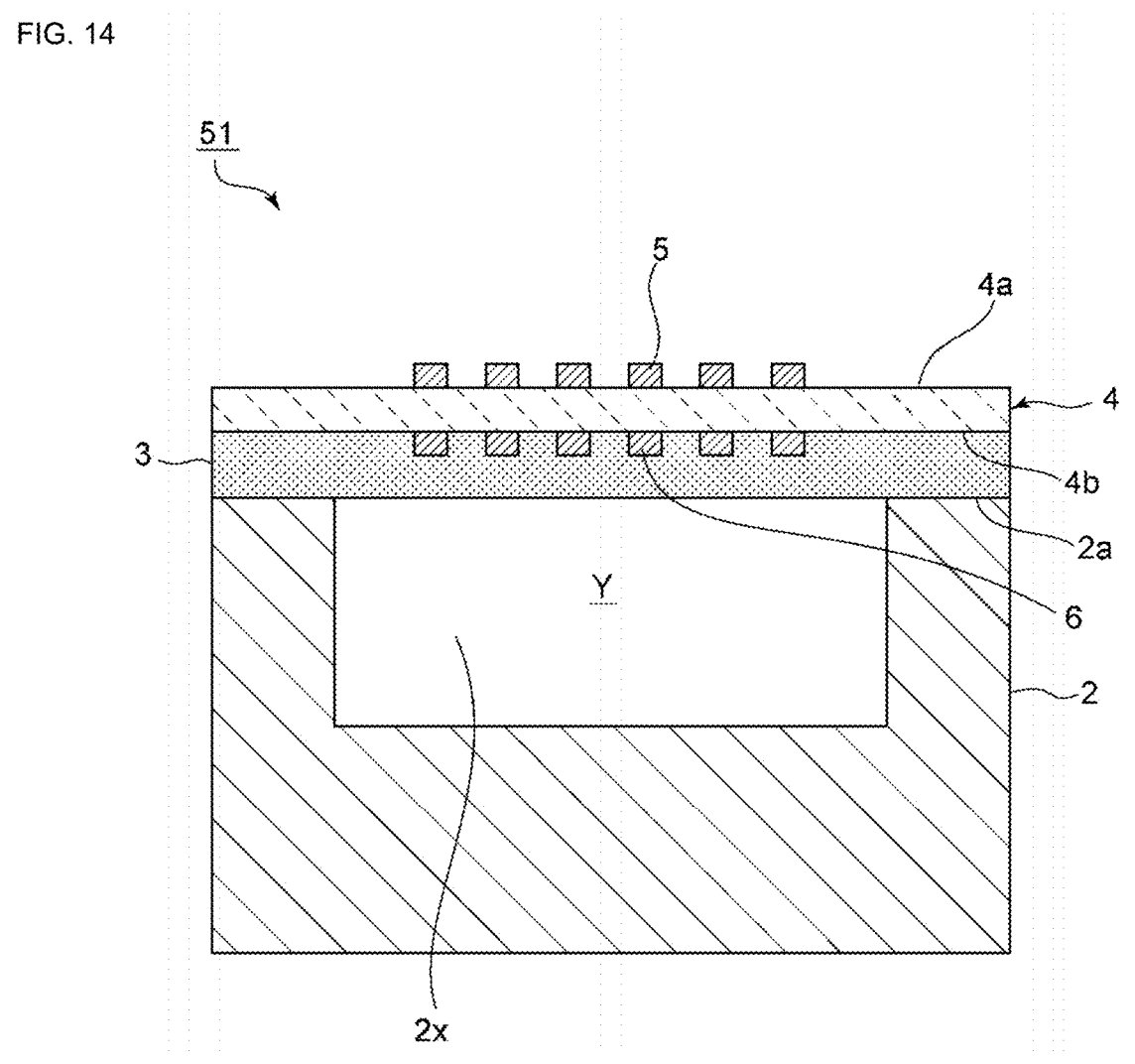

FIG. 14 is an elevational cross-sectional view of an acoustic wave device according to a fifth example embodiment of the present invention. In an acoustic wave device 51, a recessed portion 2*x* opened toward a top surface 2*a* of the support substrate 2 is formed in a portion where the silicon oxide film 3 and the support substrate 2 are stacked on each other. The silicon oxide film 3 is stacked on the top surface 2*a* of the support substrate 2. The provision of the silicon oxide film 3 may be omitted. The piezoelectric film 4 is stacked on the top surface 2*a* of the support substrate 2 directly or indirectly.

The above-described recessed portion 2*x* is closed by the silicon oxide film 3 and the piezoelectric film 4, thus forming a cavity Y. The first and second IDT electrodes 5 and 6 are located above the cavity Y.

In the fifth example embodiment, since the first and second IDT electrodes 5 and 6 are located above the cavity Y, a membrane-type acoustic wave device can be formed. In an example embodiment of the present invention, a structure in which the cavity Y is formed under the piezoelectric film 4 may be provided. In this structure, too, the first and second IDT electrodes 5 and 6 are configured similarly to those of the first example embodiment. It is thus possible to reduce the second-order nonlinear distortion even if the crystal c-axis of the piezoelectric film 4 is tilted with respect to the direction normal to the first and second main surfaces 4*a* and 4*b*.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:

a piezoelectric film including first and second main surfaces facing each other;

a first IDT electrode provided on the first main surface of the piezoelectric film; and a second IDT electrode provided on the second main surface of the piezoelectric film; wherein a crystal c-axis of the piezoelectric film is tilted with respect to a direction normal to the first and second main surfaces of the piezoelectric film;

the first IDT electrode and the second IDT electrode at least partially face each other with the piezoelectric film interposed therebetween;

each of the first and second IDT electrodes includes two comb-shaped electrodes interdigitated with each other, each of the comb-shaped electrodes including a plurality of electrode fingers and a busbar to which the plurality of electrode fingers are connected;

a direction of an electric field generated between the busbar and end portions of the electrode fingers facing the busbar in the first IDT electrode and a direction of an electric field generated between the busbar and end portions of the electrode fingers facing the busbar in the second IDT electrode are opposite directions;

the first IDT electrode includes first and second comb-shaped electrodes, the first comb-shaped electrode including a plurality of first electrode fingers and a first busbar to which the plurality of first electrode fingers are connected, the second comb-shaped electrode including a plurality of second electrode fingers and a second busbar to which the plurality of second electrode fingers are connected;

the second IDT electrode includes third and fourth comb-shaped electrodes, the third comb-shaped electrode including a plurality of third electrode fingers and a third busbar to which the plurality of third electrode fingers are connected, the fourth comb-shaped electrode including a plurality of fourth electrode fingers and a fourth busbar to which the plurality of fourth electrode fingers are connected; and regarding an electrode finger of the first IDT electrode and an electrode finger of the second IDT electrode which overlap each other with the piezoelectric film interposed therebetween, a potential of the electrode finger of the first IDT electrode and a potential of the electrode finger of the second IDT electrode are the same potential.

2. The acoustic wave device according to claim 1, wherein regarding the first busbar and the third busbar facing each other with the piezoelectric film interposed therebetween, a potential of the first busbar and a potential of the third busbar are different from each other, or regarding the second busbar and the fourth busbar facing each other with the piezoelectric film interposed therebetween, a potential of the second busbar and a potential of the fourth busbar are different from each other.

3. The acoustic wave device according to claim 2, wherein the fourth electrode fingers are each located under a gap between the end portion of the corresponding first electrode finger and the second busbar, and the third electrode fingers are each located under a gap between the end portion of the corresponding second electrode finger and the first busbar;

a region where the first and second electrode fingers overlap each other as seen in an acoustic wave propagating direction is an interdigital region; and the first electrode fingers and the fourth electrode fingers face each other in the interdigital region with the piezoelectric film interposed therebetween, and the second electrode fingers and the third electrode fingers face each other in the interdigital region with the piezoelectric film interposed therebetween.

4. The acoustic wave device according to claim 2, wherein the acoustic wave device is structured to generate an acoustic wave in an SH0 mode.

5. The acoustic wave device according to claim 1, wherein the acoustic wave device is structured to generate an acoustic wave in an S0 mode.

6. The acoustic wave device according to claim 1, further comprising:

a support substrate; and an intermediate layer provided on the support substrate; wherein the piezoelectric film is stacked on the support substrate with the intermediate layer interposed therebetween.

7. The acoustic wave device according to claim 6, wherein the intermediate layer includes a low acoustic velocity film made of a low acoustic velocity material, an acoustic velocity of a bulk wave propagating through the low acoustic velocity material being lower than an acoustic velocity of a bulk wave propagating through the piezoelectric film.

8. The acoustic wave device according to claim 7, wherein the intermediate layer further includes a high acoustic velocity film made of a high acoustic velocity material, an acoustic velocity of a bulk wave propagating through the high acoustic velocity material being higher than an acoustic velocity of an acoustic wave propagating through the piezoelectric film.

9. The acoustic wave device according to claim 6, wherein the support substrate is made of a high acoustic velocity material, an acoustic velocity of a bulk wave propagating through the high acoustic velocity material being higher than an acoustic velocity of an acoustic wave propagating through the piezoelectric film.

10. The acoustic wave device according to claim 6, wherein the intermediate layer includes a low acoustic impedance layer and a high acoustic impedance layer, the low acoustic impedance layer being made of a low acoustic impedance material of a relatively low acoustic impedance, the high acoustic impedance layer being made of a high acoustic impedance material of a relatively high acoustic impedance.

11. The acoustic wave device according to claim 1, further comprising:

a support substrate including a recessed portion on a side of a top surface of the support substrate; wherein the piezoelectric film is stacked on the support substrate such that the recessed portion defines a cavity that the piezoelectric film faces.

12. The acoustic wave device according to claim 4, wherein the piezoelectric film is made of $LiTaO_3$, a film thickness of the piezoelectric film is about 1λ or smaller, cut-angles of the $LiTaO_3$ are about −10° to about −70°, a film thickness of the first and second IDT electrodes is about 0.15λ or smaller, and a duty ratio of the first and second IDT electrodes is about 0.2 to about 0.8.

13. The acoustic wave device according to claim 6, wherein an acoustic reflective layer and a silicon oxide film are provided between the support substrate and the piezoelectric film.

14. The acoustic wave device according to claim 13, wherein the reflective layer includes high acoustic impedance layers and low acoustic impedance layers.

15. The acoustic wave device according to claim 1, further comprising:

a support substrate including a recessed portion on a side of a top surface of the support substrate; and a silicon oxide film; wherein the silicon oxide film is stacked on the support substrate such that the recessed portion defines a cavity that the silicon oxide film faces.

16. The acoustic wave device according to claim 15, wherein the piezoelectric film is stacked on the silicon oxide film.

17. The acoustic wave device according to claim 6, wherein the support substrate is made of silicon.

18. The acoustic wave device according to claim 6, wherein the support substrate has a silicon (100) plane.

* * * * *